United States Patent
Sullivan et al.

(10) Patent No.: US 7,365,550 B2
(45) Date of Patent: Apr. 29, 2008

(54) LOW IMPEDANCE TEST FIXTURE FOR IMPEDANCE MEASUREMENTS

(75) Inventors: Charles Roger Sullivan, West Lebanon, NH (US); Satish Prabhakaran, West Lebanon, NH (US)

(73) Assignee: The Trustees of Dartmouth College, Hanover, NH (US)

( * ) Notice: Subject to any disclaimer, the term of this patent is extended or adjusted under 35 U.S.C. 154(b) by 22 days.

(21) Appl. No.: 11/312,904

(22) Filed: Dec. 20, 2005

(65) Prior Publication Data

US 2006/0181293 A1 Aug. 17, 2006

Related U.S. Application Data

(63) Continuation-in-part of application No. PCT/US2004/019760, filed on Jun. 21, 2004.

(60) Provisional application No. 60/480,419, filed on Jun. 20, 2003.

(51) Int. Cl.
*G01R 31/26* (2006.01)
(52) U.S. Cl. .................... 324/754; 324/158.1
(58) Field of Classification Search ................ 324/754, 324/757; 257/48
See application file for complete search history.

(56) References Cited

U.S. PATENT DOCUMENTS

| | | | | |
|---|---|---|---|---|
| 4,308,498 A | * | 12/1981 | Madajewski et al. | 324/757 |
| 4,797,642 A | * | 1/1989 | Rennard | 333/22 R |
| 6,034,533 A | * | 3/2000 | Tervo et al. | 324/762 |
| 6,069,480 A | * | 5/2000 | Sabounchi et al. | 324/754 |
| 6,181,144 B1 | | 1/2001 | Akram et al. | |
| 2001/0048157 A1 | | 12/2001 | Murtuza | |
| 2002/0158646 A1 | | 10/2002 | Difrancesco | |

OTHER PUBLICATIONS

International Search Report, Related Application Serial No. PCT/US04/019760, Dec. 12, 2004.
Written Opinion, Related Application Serial No. PCT/US04/019760, Dec. 12, 2004.
Response to Written Opinion, Related Application Serial No. PCT/US04/019760, filed Apr. 20, 2005.

* cited by examiner

*Primary Examiner*—Vinh P. Nguyen
(74) *Attorney, Agent, or Firm*—Lathrop & Gage LC

(57) ABSTRACT

A test fixture couples with a test instrument to measure impedance of a device. An upper layer of the test fixture has (a) a first and a second solder pad for electrical connection to the device, (b) a first, second, third and fourth multi-solder pad for electrical connection to four connectors, (c) a first conductor track for connecting the first solder pad to a signal solder pad of the first multi-solder pad, (d) a second conductor track for connecting the first solder pad to a signal solder pad of the second multi-solder pad, (e) a third conductor track for connecting the second solder pad to a signal solder pad of the third multi-solder pad, and (f) a fourth conductor track for connecting the second solder pad to a signal solder pad of the fourth multi-solder pad. Each multi-solder pad has at least one return path solder pad. A lower layer of the test fixture has conductor tracks connected to the return path solder pad of each multi-solder pad. A dielectric substrate of the test fixture has substantially uniform thickness separating the upper layer from the bottom layer.

13 Claims, 3 Drawing Sheets

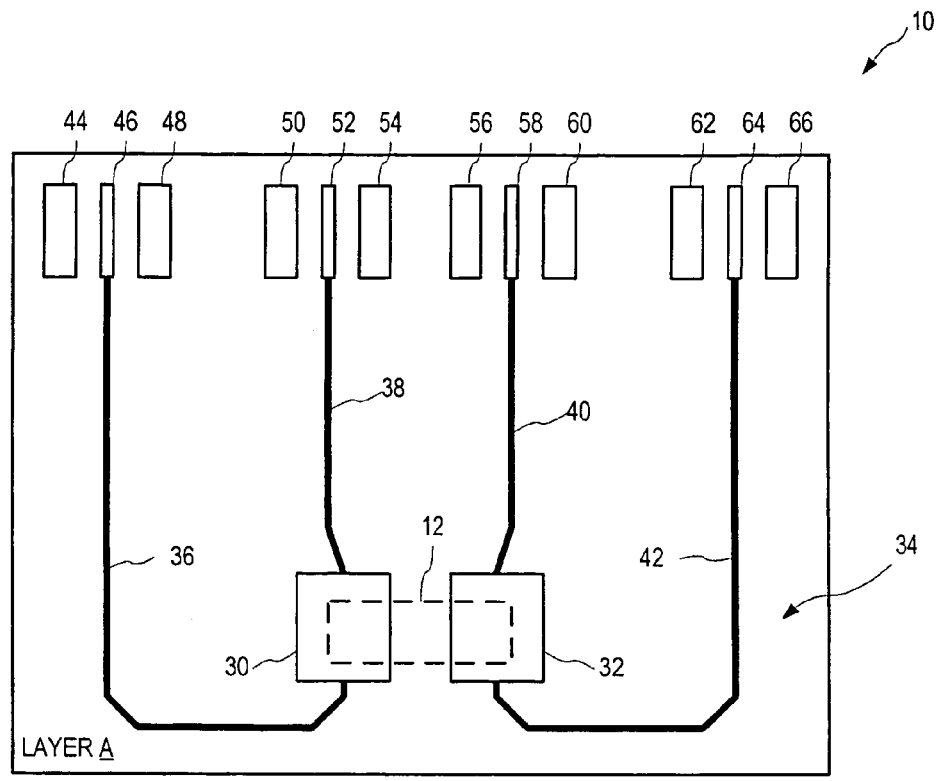
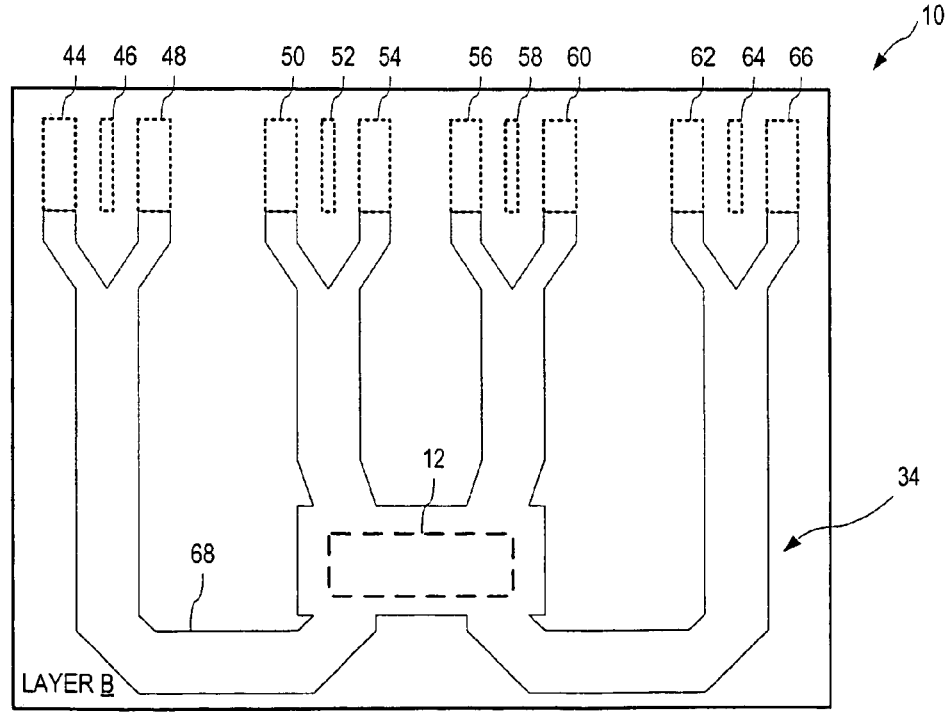

LOW IMPEDANCE TEST FIXTURE FOR IMPEDANCE MEASUREMENTS

RELATED APPLICATIONS

This application is a continuation-in-part of PCT/US2004/019760, filed Jun. 21, 2004 which claims priority to U.S. Application No. 60/480,419, filed Jun. 20, 2003, each of which is incorporated herein by reference.

BACKGROUND

For electrical and electronic component testing, a test fixture is a convenient and reliable way of connecting a "device under test" ("DUT") to test equipment. The test fixture is designed to remove measurement current from the sensing circuit, thereby eliminating spurious voltages from the sensing circuit. Typically, a four-terminal-pair ("4TP") test fixture is used to measure impedance of electronic components. The 4TP test fixture attempts to measure the voltage across the device under test and the current flowing therethrough. One pair of terminals provides an excitation signal. A second pair of terminals measures voltage. A third pair of terminals is used to provide feedback for maintaining a virtual ground at one terminal of the DUT; and a fourth pair of terminals is used to source the current needed to effect the virtual ground and to measured the sourced current (which is equal to the current through the DUT). The process of maintaining a virtual ground at one end of the DUT is referred to as the auto-balancing bridge (ABB) technique.

The impedance of the DUT is calculated from the relationship Z=V/I, where Z is the impedance of the DUT, V is the voltage measured across the DUT, and I is the current flowing through the DUT. The measurement current is normally sinusoidal, and includes both magnitude and phase components for current and voltage. From these measurements, both the resistive and reactive components of the DUT are determined. For example, the impedance of an inductor consists of both its inductive and resistive components, j, $\omega$, L and R.

The test fixture typically incorporates stray impedance. In cases where the stray impedance is significantly less that the impedance of the DUT, it is often ignored. The stray impedance can be reduced by calibration procedures. The simplest calibration procedure involves temporarily replacing the DUT with a short, and then 'zeroing' test equipment. For compensation of parallel stray impedances, the test fixture can be used with no DUT or short in place—an "open" calibration. A known impedance, usually resistive, can also be used for a third calibration step, referred to as "load" calibration.

A wide range of commercially available test fixtures are used throughout industry; they are often designed for ease of use, and accept a wide range of DUTs.

Recent improvements in test equipment performance allow low impedances to be measured more accurately. However, the stray impedance of most test fixtures significantly limits the accuracy of these measurements. The way in which the DUT is mounted contributes significantly to the stray impedance. Most commercially available 4TP test fixtures have stray impedance levels that prevent accurate measurement of low impedances, even after calibration.

SUMMARY

A test fixture couples with a test instrument to measure impedance of a device. An upper layer of the test fixture has (a) a first and a second solder pad for electrical connection to the device, (b) a first, second, third and fourth multi-solder pad for electrical connection to four connectors, (c) a first conductor track for connecting the first solder pad to a signal solder pad of the first multi-solder pad, (d) a second conductor track for connecting the first solder pad to a signal solder pad of the second multi-solder pad, (e) a third conductor track for connecting the second solder pad to a signal solder pad of the third multi-solder pad, and (f) a fourth conductor track for connecting the second solder pad to a signal solder pad of the fourth multi-solder pad. Each multi-solder pad has at least one return path solder pad. A lower layer of the test fixture has conductor tracks connected to the return path solder pad of each multi-solder pad. A dielectric substrate of the test fixture has uniform thickness separating the upper layer from the bottom layer.

In one embodiment, a process measures impedance of a device with test equipment and a low impedance test fixture. A short is soldered to solder pads of the test fixture and the test equipment is calibrated to the test fixture. The device is soldered to the solder pads in place of the short. The test equipment is operated to measure the impedance of the device.

In one embodiment, a test fixture couples with a test instrument to measure impedance of a device. An upper layer has (a) a first and a second solder pad for electrical connection to the device, (b) a plurality of multi-solder pads for electrical connection to a like plurality of connectors, (c) a first plurality of conductor tracks for connecting the first solder pad to select solder pads of a first set of the multi-solder pads, and (d) a second plurality of conductor tracks for connecting the second solder pad to select solder pads of a second set of the multi-solder pads. A lower layer has a third plurality of conductor tracks connected to at least one return path solder pad of each of the multi-solder pads. A dielectric substrate of uniform thickness separates the upper layer from the bottom layer.

In one embodiment, a test fixture couples with a test instrument to measure impedance of a device. A dielectric substrate of uniform thickness has an upper surface and a lower surface. First and second solder pads for electrical connection to the device are located on the upper surface. The test fixture has a first group of solder pads for connecting to a first connector; a first pair of tracks, including a first signal track on the upper surface aligned with and parallel to a first return path on the lower surface, for connecting the first solder pad and the first group of solder pads; a second group of solder pads for connecting to a second connector; a second pair of tracks, including a second signal track on the upper surface aligned with and parallel to a second return path on the lower surface, for connecting the first solder pad and the second group of solder pads; a third group of solder pads for connecting to a third connector; a third pair of tracks, including a third signal track on the upper surface aligned with and parallel to a third return path on the lower surface, for connecting the second solder pad and the third group of solder pads; a fourth group of solder pads for connecting to a fourth connector; and a fourth pair of tracks, including a fourth signal track on the upper surface aligned with and parallel to a fourth return path on the lower surface, for connecting the second solder pad and the fourth group of solder pads.

BRIEF DESCRIPTION OF THE FIGURES

FIG. 2 shows a top view, including an upper layer embodiment of the test fixture of FIG. 1.

FIG. 3 shows a top view, including a lower layer embodiment of the test fixture of FIG. 1.

DETAILED DESCRIPTION OF THE FIGURES

Figure 1:
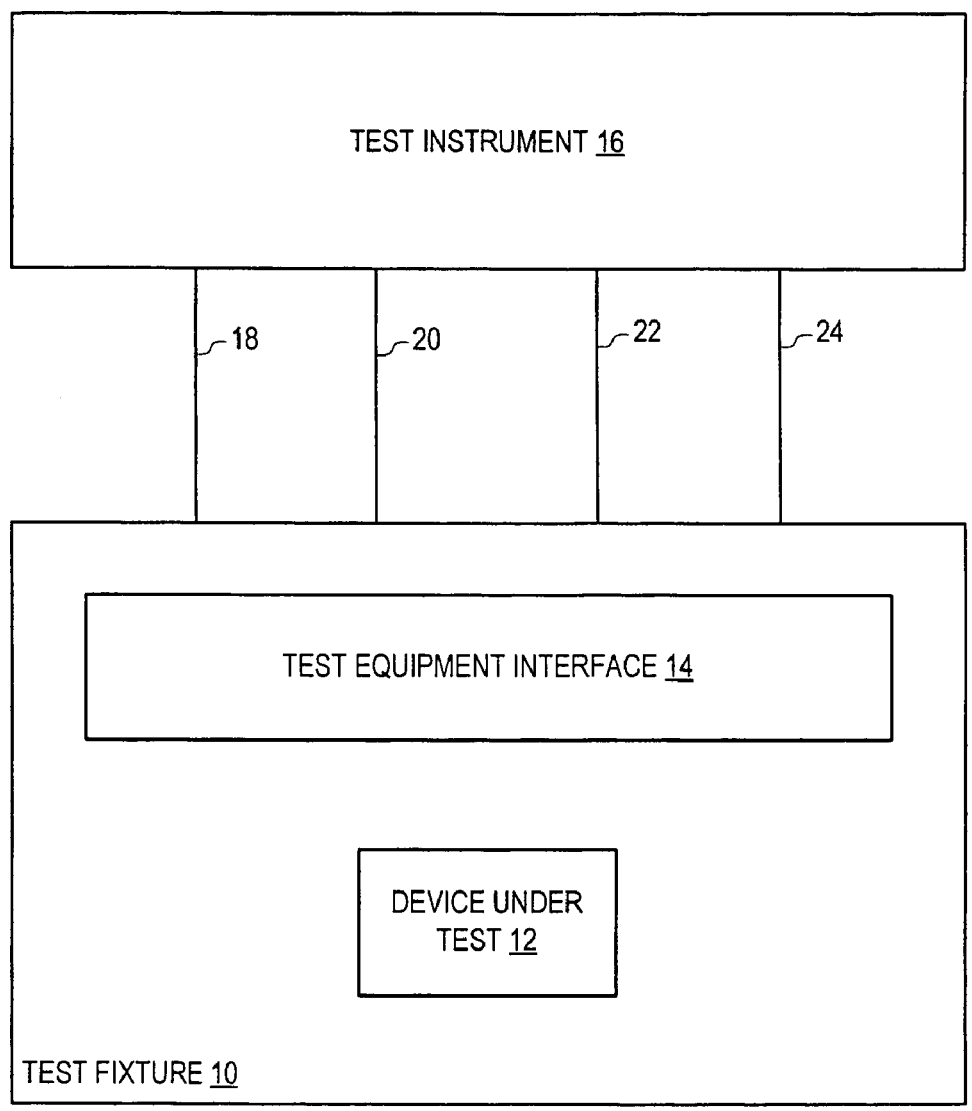
FIG. 1 is a block diagram illustrating an embodiment of one low impedance test fixture for impedance measurement.

FIG. 1 is a block diagram illustrating one low impedance test fixture 10 for impedance measurement. In FIG. 1, test fixture 10 is illustratively shown measuring the impedance of a device under test ("DUT") 12, and is connected to a test instrument 16 by connections 18, 20, 22 and 24. In one embodiment, test fixture 10 is designed to measure the impedance of power devices (e.g., DUT 12) using a four-terminal-pair ("4TP") auto-balance bridge system. Such power devices are typically utilized in high-performance, high-current power supplies where measurement of low impedances is critical. To measure low impedances, particularly at frequencies extending into the MHz range, test fixture 10 operates with low stray impedance, since stray impedance introduces errors into measurements. Test fixture 10 has less than about 100 pH stray inductance and is therefore suitable for such measurements.

Test instrument 16 is for example an impedance analyzer that uses the 4TP auto-balance bridge system (e.g., analyzer 4294A made by Agilent).

In one embodiment, test fixture 10 includes a two-layer printed circuit board construction based on a dielectric substrate of between 10-200 μm (shown as surface 34 in FIG. 2). In one example, the dielectric substrate is 75 μm polyimide, or fiberglass. The dielectric substrate contains conductor tracks, where the tracking may be metal, such as copper, or a conductive polymer. In FIG. 2, layer A represents an upper layer of test fixture 10. Layer A shows two solder pads, 30 and 32, that connect to DUT 12 (e.g., DUT 12 is soldered to pads 30 and 32 to make the measurement). Layer A also contains solder pads 44, 46, 48, 50, 52, 54, 56, 58, 60, 62, 64 and 66 that allow surface mount assembly ("SMA") type connectors to be attached to test fixture 10. SMA type connectors provide for connectivity between test fixture 10 and test instrument 16, for example, and it will be appreciated that the connection to test instrument 16 may be facilitated by various types of adaptors. Three solder pads connect to each connector. Solder pads 44, 46 and 48 connect to a first connector; solder pads 50, 52 and 54 connect to a second connector; solder pads 56, 58 and 60 connect to a third connector; and solder pads 62, 64 and 66 connect to a fourth connector. Layer A also contains conductor tracks 36, 38, 40 and 42 that respectively connect DUT 12 to signal solder pads 46, 52, 58 and 64.

FIG. 3 is a schematic diagram illustrating a layer B representing a lower layer of test fixture 10, viewed from above. Layer B shows solder pads 44 through 66 of FIG. 2 (in dotted outline) for purposes of illustration, though some or all pads 44 through 66 may alternatively be included on lower layer B of test fixture 10 as a matter of design choice. Layer B also includes a return track 68 that connects to solder pads 44, 48, 50, 54, 56, 60, 62 and 66 of layer A (and/or optionally of layer B).

With reference to FIG. 2 and FIG. 3, it can be seen that return track 68 is a closely-spaced ground/return path that induces low stray inductance and duplicates boundary conditions and field configuration in a typical high-performance application. By using wide copper traces on the thin polyimide substrate, stray inductance is reduced, for example, to 62 pH. While the resistance of solder pads 30 and 32 may in some cases be significant, results are more repeatable than those obtained using test fixtures with dry contacts. Further, solder pads 30 and 32 realistically model the way in which a component is used.

Solder pads 30 and 32 are large rectangular areas on layer A with equal areas in return track 68 of layer B. On layer B, return track 68 follows the same path as tracks 36, 38, 40 and 42 of layer A, thereby forming 50 ohm transmission lines used by test instrument 16, FIG. 1.

Solder pads 30 and 32 may be designed such that measurements are repeatable with DUT 12 soldered in different positions. Solder pads 30 and 32 may thus be constructed to minimize effects of different soldering positions, particularly when replacing a short, soldered to solder pads 30 and 32 for calibration of test fixture 10, with DUT 12, which would induce errors.

Test fixture 10 may reduce the effect of stray capacitance due to the shielding effect of the close-spaced return track 68. The combination of low stray inductance and low stray capacitance means that the frequency range of test fixture 10 is 0-40 GHz without the resonant frequency of test fixture 10 having measurement effect. Further, the low stray impedance of test fixture 10 may allow test fixture 10 to measure low impedance devices more accurately than prior art test fixtures. The design of test fixture 10 may reduce construction costs compared to other commercially available test fixtures.

Figure 4:
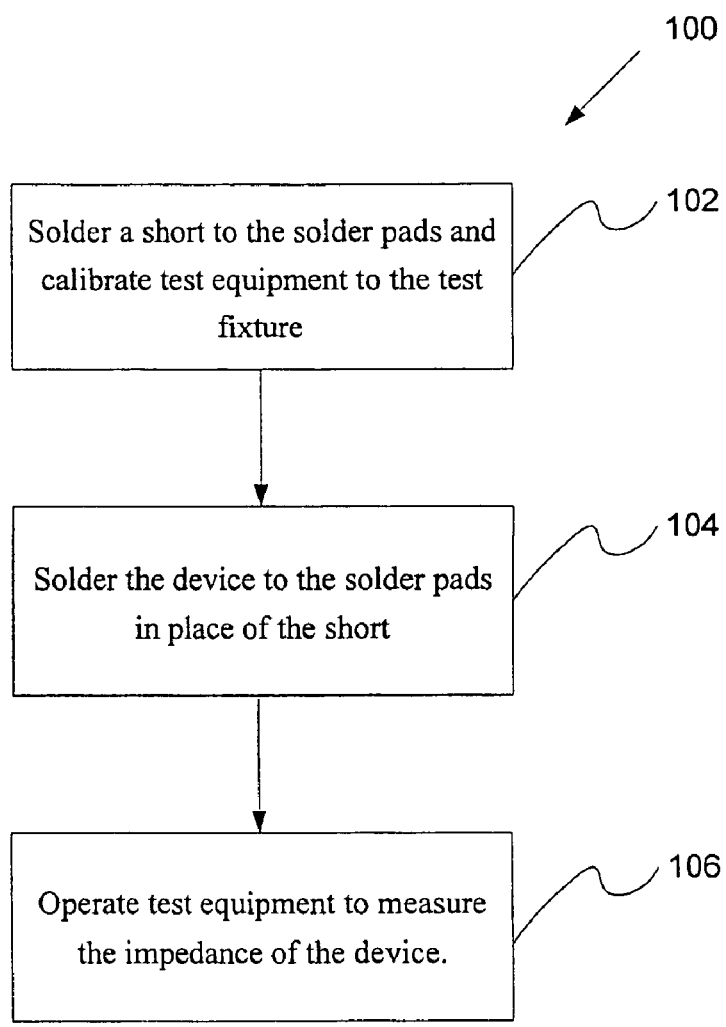
FIG. 4 is a flowchart illustrating a process embodiment for measuring impedance with a low impedance test fixture.

FIG. 4 shows a process 100 for measuring impedance of a device with test equipment and a low impedance test fixture. In step 102, a short is soldered to solder pads of the test fixture and the test equipment is calibrated to the test fixture. Optionally, open and/or load calibrations are then performed. In step 104, the device is soldered to the solder pads in place of the short. In step 106, the test equipment is operated to measure the impedance of the device.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A test fixture for coupling with a test instrument to measure impedance of a device, comprising:

an upper layer having (a) a first and a second solder pad for physical and electrical connection to the device, (b) a first, second, third and fourth multi-solder pad for electrical connection to four connectors, (c) a first conductor track for connecting the first solder pad to a signal solder pad of the first multi-solder pad, (d) a second conductor track for connecting the first solder pad to a signal solder pad of the second multi-solder pad, (e) a third conductor track for connecting the second solder pad to a signal solder pad of the third multi-solder pad, and (f) a fourth conductor track for connecting the second solder pad to a signal solder pad of the fourth multi-solder pad, each multi-solder pad having at least one return path solder pad;

a lower layer having conductor tracks connected to the return path solder pad of each multi-solder pad; and a dielectric substrate of uniform thickness separating the upper layer from the lower layer.

2. The test fixture of claim 1, wherein an impedance of about 50 ohms is formed by one of the conductor tracks on the upper layer and a corresponding track on the lower layer.

3. The test fixture of claim 1, wherein none of the conductor tracks intersect each other.

4. The test fixture of claim 1, wherein the dielectric substrate is about 75 μm thick.

5. A test fixture for coupling with a test instrument to measure impedance of a device, comprising:
- an upper layer having (a) a first and a second solder pad for physical and electrical connection to the device, (b) a plurality of multi-solder pads for electrical connection to a like plurality of connectors, (c) a first plurality of conductor tracks for connecting the first solder pad to select solder pads of a first set of the multi-solder pads, and (d) a second plurality of conductor tracks for connecting the second solder pad to select solder pads of a second set of the multi-solder pads,
- a lower layer having a third plurality of conductor tracks connected to at least one return path solder pad of each of the multi-solder pads; and
- a dielectric substrate of uniform thickness separating the upper layer from the lower layer.

6. The test fixture of claim 5, wherein an impedance of about 50 ohms is formed by one of the conductor tracks on the upper layer and a corresponding track on the lower layer.

7. The test fixture of claim 5, wherein none of the conductor tracks intersect each other.

8. The test fixture of claim 5, wherein the dielectric substrate is about 75 μm thick.

9. A test fixture for coupling with a test instrument to measure impedance of a device, comprising:
- a dielectric substrate of uniform thickness having an upper surface and a lower surface;
- first and second solder pads for physical and electrical connection to the device, the first and second solder pads located on the upper surface;
- a first group of solder pads for connecting to a first connector;
- a first pair of tracks, comprising a first signal track on the upper surface aligned with and parallel to a first return path on the lower surface, for connecting the first solder pad and the first group of solder pads;
- a second group of solder pads for connecting to a second connector;
- a second pair of tracks, comprising a second signal track on the upper surface aligned with and parallel to a second return path on the lower surface, for connecting the first solder pad and the second group of solder pads;
- a third group of solder pads for connecting to a third connector;
- a third pair of tracks, comprising a third signal track on the upper surface aligned with and parallel to a third return path on the lower surface, for connecting the second solder pad and the third group of solder pads;
- a fourth group of solder pads for connecting to a fourth connector; and
- a fourth pair of tracks, comprising a fourth signal track on the upper surface aligned with and parallel to a fourth return path on the lower surface, for connecting the second solder pad and the fourth group of solder pads.

10. The test fixture of claim 9, wherein an impedance of about 50 ohms is formed by one of the conductor tracks on the upper layer and a corresponding track on the lower layer.

11. The test fixture of claim 9, wherein none of the conductor tracks intersect each other.

12. The test fixture of claim 9, wherein the dielectric substrate is about 75 μm thick.

13. The test fixture of claim 9, wherein each pair of tracks is spaced from other pairs of tracks to reduce inductive and capacitive coupling.

* * * * *